(12) United States Patent
Kim et al.

(10) Patent No.: US 9,502,536 B2
(45) Date of Patent: Nov. 22, 2016

(54) MANUFACTURING METHOD OF THIN FILM TRANSISTOR DISPLAY PANEL

(71) Applicant: Samsung Display Co., Ltd., Yongin-si, Gyeonggi-Do (KR)

(72) Inventors: Dong Il Kim, Suwon-si (KR); Joo Hyung Lee, Seongnam-si (KR); Jae Woo Jeong, Suwon-si (KR)

(73) Assignee: Samsund Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/795,578

(22) Filed: Jul. 9, 2015

(65) Prior Publication Data
US 2016/0197165 A1    Jul. 7, 2016

(30) Foreign Application Priority Data

Jan. 2, 2015  (KR) .................. 10-2015-0000232

(51) Int. Cl.
| | | |
|---|---|---|
| *H01L 21/467* | (2006.01) | |
| *H01L 21/786* | (2006.01) | |
| *H01L 29/66* | (2006.01) | |
| *H01L 27/12* | (2006.01) | |
| *H01L 21/308* | (2006.01) | |
| *H01L 21/3065* | (2006.01) | |
| *H01L 21/306* | (2006.01) | |

(52) U.S. Cl.
CPC ..... *H01L 29/66765* (2013.01); *H01L 21/3065* (2013.01); *H01L 21/3081* (2013.01); *H01L 21/3085* (2013.01); *H01L 21/30604* (2013.01); *H01L 27/127* (2013.01); *H01L 27/1288* (2013.01)

(58) Field of Classification Search
CPC .................................................. H01L 21/0335
See application file for complete search history.

(56) References Cited

U.S. PATENT DOCUMENTS 8,021,937 B2 *  9/2011  Roh .................... H01L 27/1285
                                                   257/E21.414
2010/0099263 A1    4/2010  Kao et al.
2013/0089988 A1 *  4/2013  Wang ................ H01J 37/32357
                                                   438/719

FOREIGN PATENT DOCUMENTS

| KR | 10-2007-0093510 A | 9/2007 |
| KR | 10-2008-0035045 A | 4/2008 |
| KR | 20-0468457 Y1 | 8/2013 |

* cited by examiner

*Primary Examiner* — Stephen W Smoot
(74) *Attorney, Agent, or Firm* — Robert E. Bushnell, Esq.

(57) ABSTRACT

Provided is a manufacturing method of a thin film transistor array panel including: formation of a gate line including a gate electrode on a substrate; formation of sequentially a gate insulating layer, an active layer, a data metal layer, and a photoresist etching mask pattern on the gate line; etching the data metal layer with the same shape as the photoresist etching mask pattern; etching the active layer by using the photoresist etching mask pattern; formation of a data line including a source electrode and a drain electrode for completing a channel region on the active layer; and formation of a pixel electrode exposing the drain electrode and electrically connected with the drain electrode, in which in the etching of the active layer, a dry-etch process is performed by using gas including at least one of NF3 and H2.

9 Claims, 18 Drawing Sheets

FIG. 12

| CSTID | Slot | Initial value | Etch time | Late value | a-Si Etch rate | Etch rate per second |
|---|---|---|---|---|---|---|
| 2166 | 13 | 1720.75 | 33 | 1481.8 | 239 | 7.24 |
| | 14 | 1777.167 | 39 | 1496.6 | 280.58 | 7.19 |
| | 15 | 1784.417 | 45 | 1510.2 | 274.25 | 6.09 |
| | 16 | 1768.833 | 51 | 1486.2 | 282.67 | 5.54 |
| | 17 | 1753.667 | 57 | 1472.8 | 280.83 | 4.93 |
| | 18 | 1793.083 | 63 | 1499.9 | 293.17 | 4.65 |
| | 19 | 1723.333 | 69 | 1447.3 | 276.08 | 4.00 |
| | 20 | 1775.5 | 75 | 1483.7 | 291.83 | 3.89 |

MANUFACTURING METHOD OF THIN FILM TRANSISTOR DISPLAY PANEL

CLAIM OF PRIORITY

This application claims the priority to and all the benefits accruing under 35 U.S.C. §119 of Korean Patent Application No. 10-2015-0000232 filed in the Korean Intellectual Property Office (KIPO) on Jan. 2, 2015, the entire contents of which are incorporated herein by reference.

BACKGROUND OF THE INVENTION

1. Field of Disclosure

The present invention relates to a manufacturing method of a thin film transistor array panel.

2. Description of the Related Art

A display device may use a flat panel display, and as the flat panel display, various display devices such as a liquid crystal display, an organic light emitting diode display, a plasma display device, an electrophoretic display device, and an electrowetting display device may be used.

A representative liquid crystal display among them, which is one of the most common types of flat panel displays currently in use, includes two display panels with field generating electrodes such as a pixel electrode and a common electrode, and a liquid crystal layer interposed therebetween, and includes a backlight unit which provides light onto the display panels sandwiched with the liquid crystal layer therebetween. The liquid crystal display generates an electric field in the liquid crystal layer by applying a voltage to the field generating electrodes, determines directions of liquid crystal molecules of the liquid crystal layer by the generated electric field, and controls an emission amount of light provided by the backlight unit, thereby displaying images.

Generally, a plurality of gate lines which are parallel to each other, and a plurality of source lines which insulatively cross the gate lines are formed on the display panel, and pixels are formed for each region surrounded by the gate lines and the data lines. In each pixel, a pixel electrode and a switching element (thin film transistor) applying a pixel voltage to the pixel electrode are disposed.

The thin film transistor array panel includes a gate electrode which is a part of the gate line, a semiconductor layer forming a channel, and a source electrode and a drain electrode which are a part of the data line. The thin film transistor is a switching element that transfers or blocks an image signal transferred through the data line to the pixel electrode according to a scanning signal transferred through the gate line.

Meanwhile, the gate lines, the data lines, and the switching element are formed by a photolithography process using an exposure mask.

Since the exposure mask forms a large part in manufacturing cost, recently, a four-sheet mask process and a five-sheet mask process have been developed in order to reduce the manufacturing cost and the manufacturing process.

For example, in the four-sheet mask process, a source metal pattern including a source line is formed by sequentially coating a semiconductor layer, an ohmic contact layer, and a metal layer on a base substrate where a gate metal pattern including the gate line is formed and patterning the metal layer by a photolithography process. Subsequently, in the source metal pattern, a channel layer which is patterned to be the same as the source metal pattern, is formed by dry-etching the ohmic contact layer and the semiconductor layer by an etching mask. Generally, in the dry-etch process for forming the channel layer, HCl or $SF_6$ gas is used as etching gas.

Meanwhile, in the dry-etch process, since the source metal pattern is exposed to dry-etching gas, the etching gas reacts with the metal material forming the source metal pattern to form reaction by-products. There is a problem in that the reaction by-products formed above remain around the source metal pattern to cause a wiring defect. Particularly, when the source metal pattern includes copper (Cu) having weak chemical resistance, there is a problem in that the above-mentioned reaction by-products are significantly increased.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a manufacturing method of a thin film transistor array panel having advantages of preventing corrosion of a source metal pattern by preventing an etch surface of the source metal pattern from being exposed in a dry-etch process.

An exemplary embodiment of the present invention provides a manufacturing method of a thin film transistor array panel including the formation of a gate line including a gate electrode on a substrate; the sequential formation of a gate insulating layer, an active layer, a data metal layer, and a photoresist etching mask pattern on the gate line; etching of the data metal layer with the same shape as the photoresist etching mask pattern; etching of the active layer by using the photoresist etching mask pattern; the formation of a data line including a source electrode and a drain electrode on the active layer; and the formation of a pixel electrode exposing the drain electrode and electrically connected with the drain electrode, in which in the etching of the active layer, a dry-etch process based on $NF_3$ and $H_2$ gas series is used.

The active layer may include an intrinsic amorphous silicon layer and an impurity doped amorphous silicon layer sequentially formed on the gate insulating layer.

Etching of the active layer may further include formation of a silicon compound on an etch surface of the data metal layer by the dry-etch process.

The formation of the data line may include exposing a part of the data metal layer by etching the photoresist etching mask pattern with a predetermined thickness through ashing; and formation of a source electrode and a drain electrode of the thin film transistor by etching the exposed data metal layer.

In the formation of the source electrode and the drain electrode of the thin film transistor, the data metal layer may be etched by a wet etching process.

In this case, when the wet etching process for the data metal layer is performed, the silicon compound formed on the etch surface of the data metal layer may prevent the etch surface of the data metal layer from being etched.

Further, at least one of low pressure and high bias power may be set to be satisfied as the ashing condition of the photoresist etching mask pattern.

The manufacturing method may further include etching the impurity doped amorphous silicon layer exposed between the source electrode and the drain electrode of the thin film transistor.

In this case, etching of the impurity doped amorphous silicon layer exposed between the source electrode and the drain electrode of the thin film transistor may be performed by a wet etching process.

Further, in the etching of the impurity doped amorphous silicon layer exposed between the source electrode and the drain electrode of the thin film transistor, the silicon compound formed on the etch surface of the data metal layer may be etched.

According to the exemplary embodiment of the present invention, it is possible to prevent corrosion of the source metal pattern by depositing a silicon compound on a side of a data metal layer during the dry-etch process and preventing an etch surface of the data metal layer from being exposed through the deposited silicon compound, by using a $NF_3/H_2$ gas-based dry-etch process.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 12 and 13 are diagrams for describing a performance experiment result of a wet etching process with respect to an impurity doped amorphous silicon layer according to the exemplary embodiment of the present invention;

DETAILED DESCRIPTION OF THE INVENTION

Figure 1:
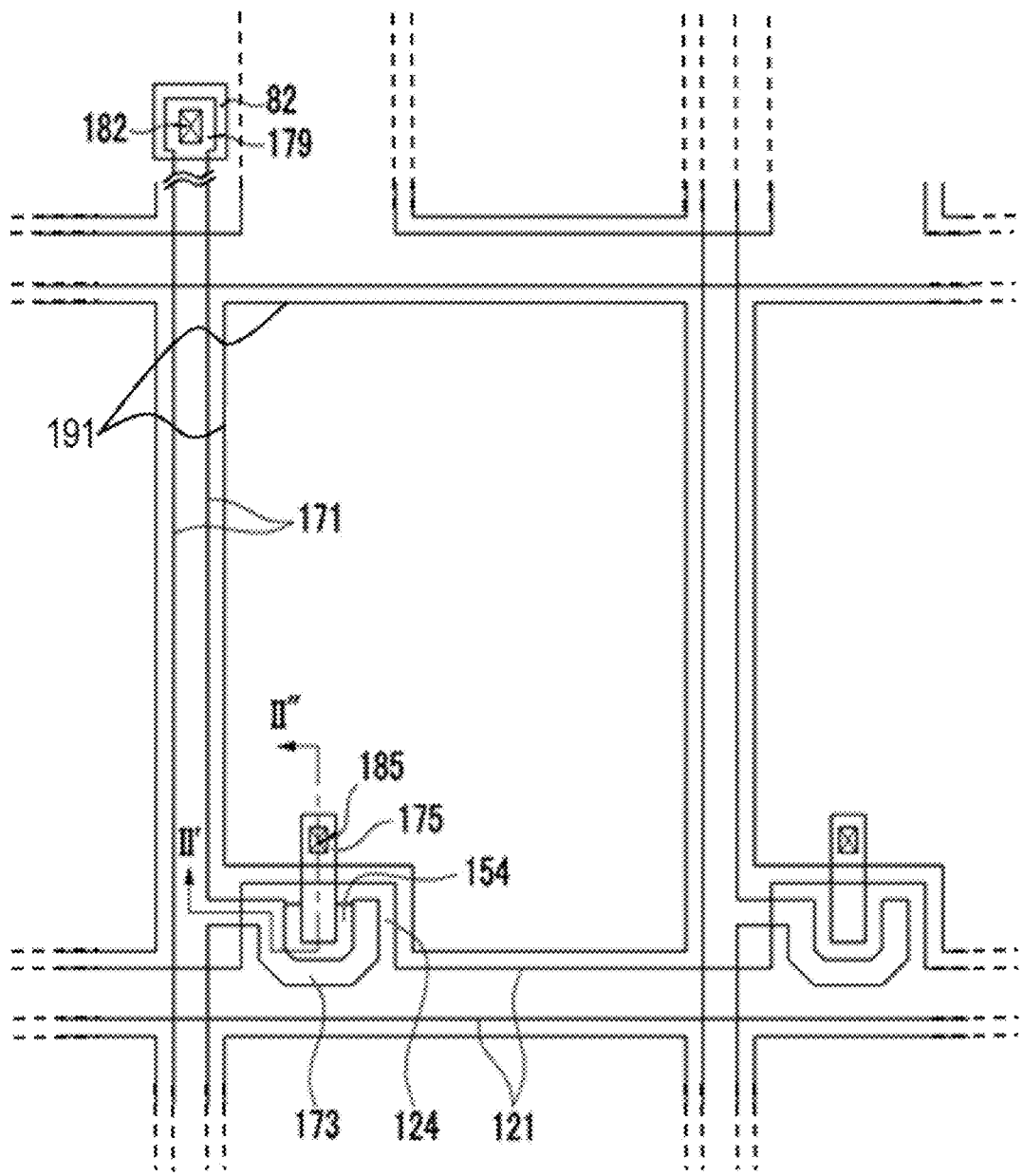
FIG. 1 is a plan view illustrating a thin film transistor array panel according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
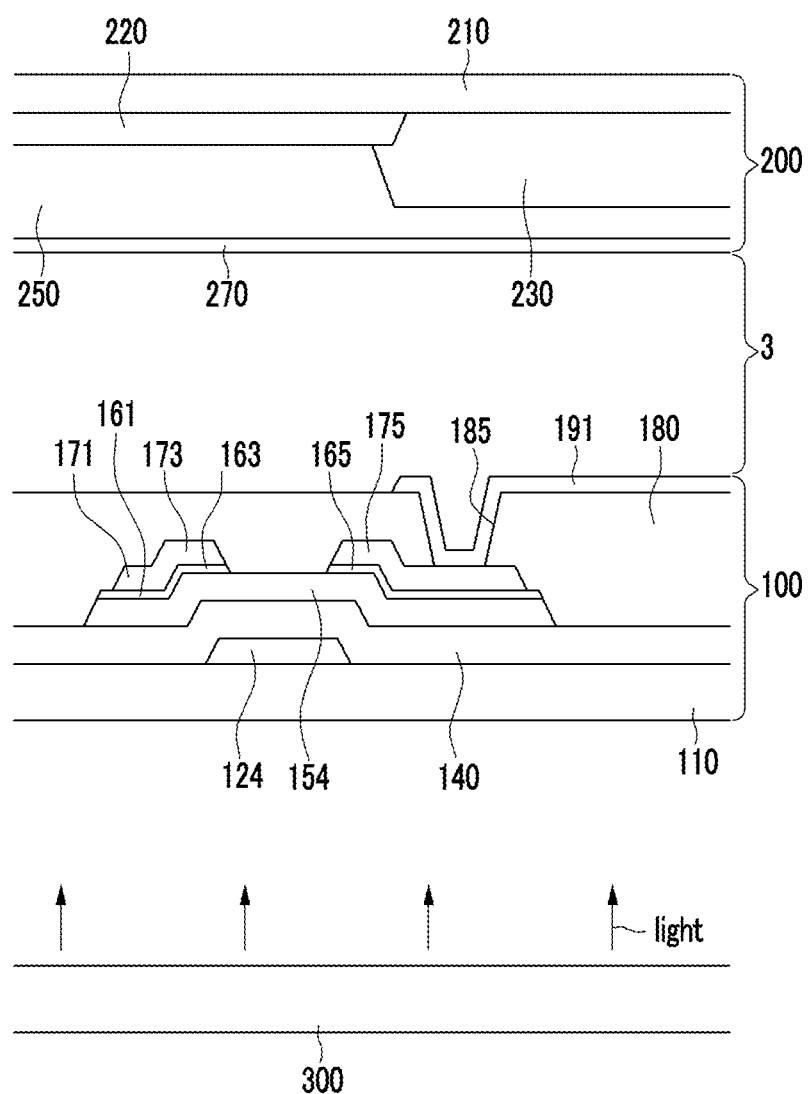
FIG. 2 is a cross-sectional view taken along line II'-II" of FIG. 1.

Hereinafter, a thin film transistor array panel according to an exemplary embodiment of the present invention will be described in detail with the accompanying drawings FIG. 1 is a plan view illustrating a thin film transistor array panel according to an exemplary embodiment of the present invention, and FIG. 2 is a cross-sectional view taken along line II'-II" of FIG. 1.

First, referring to FIGS. 1 and 2, the liquid crystal display includes a thin film transistor array panel 100, an upper panel 200, a liquid crystal layer 3 interposed between the two display panels 100 and 200, and a backlight unit 300 positioned below the thin film transistor array panel 100. Further, the position of the backlight unit 300 is not limited to a position facing the thin film transistor array panel 100, and the backlight unit 300 may be disposed at a position facing the upper panel 200.

First, the thin film transistor array panel 100 will be described.

On a first insulation substrate 110 made of transparent glass or plastic, a plurality of gate lines extended in a first direction and a plurality of data lines extended in a second direction crossing the first direction are positioned. A plurality of pixel units is defined by the gate lines and the data lines on the first insulation substrate 110.

The gate line 121 transfers a gate signal and extends mainly in a horizontal direction. Each gate line 121 includes a plurality of gate electrodes 124 protruding from the gate line 121 and a gate pad 129 which is a wide end portion for connecting with other layers or a gate driver (not illustrated).

The gate electrode 124 may be formed with the same metal pattern as the gate line. In the exemplary embodiment of the present invention, illustrated is only the case in which the gate electrode 124 is constituted by a single layer, but the gate electrode may be constituted by double layers.

As an example, when the gate electrode 124 is a double layer, the gate electrode 124 may have a structure in which a lower metal layer made of any one selected from aluminum (Al) and aluminum neodymium (AlNd) and an upper metal layer made of molybdenum (Mo) are sequentially laminated.

The lower metal layer as a layer serving as a passage of an electric signal which is an original function of the wiring is made of aluminum (Al) and aluminum neodymium (AlNd) having low specific resistance.

The upper metal layer as a layer positioned for protecting the lower metal layer serves to prevent hillock of aluminum (Al) caused in a subsequent process at a high temperature and lower contact resistance between the pixel electrode and the lower metal layer.

Next, a gate insulating layer 140 made of an insulating material such as silicon nitride is positioned on the gate line 121. Although not illustrated, the gate insulating layer 140 may be configured by a lower gate insulating layer that prevents the gate electrode 124 from being oxidized by being made of an insulating material such as silicon nitride and an upper gate insulating layer for preventing a characteristic from deteriorating due to reaction of the adjacent semiconductor layer 154 and oxygen by being made of a nitrogen-rich insulating material as compared with the lower gate insulating layer.

Next, a semiconductor layer 154 made of amorphous silicon, particularly, hydrogenated amorphous silicon or polysilicon is positioned on the gate insulating layer 140. In the exemplary embodiment of the present invention, the semiconductor layer 154 including hydrogenated amorphous silicon (a-Si:H) is preferable.

The semiconductor layer 154 mainly extends in a vertical direction of a side of the display panel adjacent to the gate driver and includes a plurality of projections protruding toward the gate electrode 124.

A plurality of ohmic contact stripes 161 and ohmic contact islands 165 are positioned on the projections of the semiconductor layer 154. The ohmic contact stripes 161 have a plurality of projections 163, and the projections 163 and the ohmic contact islands 165 make pairs and are positioned on the projections of the semiconductor layer 154.

On the ohmic contacts 161 and 165 and the gate insulating layer 140, a plurality of data lines 171, a plurality of source electrodes 173 connected to the plurality of data lines 171, and a plurality of drain electrodes 175 facing the source electrodes 173 are positioned.

The data line 171 transfers a data signal and mainly extends in a vertical direction to cross the gate line 121. The source electrode 173 extends toward the gate electrode 124 to have a U-lettered shape, but it is just an example and the source electrode 173 may have variously modified shapes.

The drain electrode 175 is separated from the data line 171 and extends upward from the center of the U-lettered shape of the source electrode 173. An area of the data line 171 includes a data pad 179 for connecting with another layer or a data driver (not illustrated).

Although not illustrated, the data line 171, the source electrode 173, and the drain electrode 175 may also have double-layered structures of upper and lower layers. The upper layer may be formed of copper (Cu) or a copper alloy, and the lower layer may be formed of one of titanium (Ti), tantalum (Ta), molybdenum (Mo), and alloys thereof.

The data line 171, the source electrode 173, and the drain electrode 175 may have tapered sides.

The ohmic contacts 161 and 165 exist only between the semiconductor layer 154 therebelow and the data line 171 and the drain electrode 175 thereabove, and serves to decrease contact resistance therebetween. Further, the ohmic contacts 161, 163, and 165 may have substantially the same planar pattern as the data line 171, the source electrode 173, and the drain electrode 175.

The projections of the semiconductor layer 154 have an exposed portion which is not covered by the data line 171 and the drain electrode 175 including a space between the source electrode 173 and the drain electrode 175. The semiconductor layer 154 has substantially the same planar pattern as the ohmic contacts 161 and 165 except for the exposed portion of the projections.

One gate electrode 124, one source electrode 173, and one drain electrode 175 form one thin film transistor (TFT) together with the projections of the semiconductor 154, and a channel of the thin film transistor is formed in the projection between the source electrode 173 and the drain electrode 175.

A passivation layer 180 is positioned on the data line 171, the drain electrode 175, and the exposed projection portion of the semiconductor layer 154. The passivation layer 180 is made of an inorganic insulating material such as silicon nitride or silicon oxide, an organic insulating material, a low-dielectric insulator, and the like.

A contact hole 181 exposing the gate pad 129 is positioned in the passivation layer 180 and the gate insulating layer 140. Further, in the passivation layer 180, a contact hole 182 exposing the data pad 179 of the data line 171 and a contact hole 185 exposing one end of the drain electrode 175 are positioned.

The pixel electrode 191 and contact aids 81 and 82 are positioned on the passivation layer 180. The pixel electrode 191 and the contact aids 81 and 82 may be made of a transparent conductive material such as ITO or IZO, or reflective metal such as aluminum silver, chromium, or an alloy thereof.

The pixel electrode 191 is physically and electrically connected to the drain electrode 175 through the contact hole 185, and receives a data voltage from the drain electrode 175.

The contact aids 81 and 82 are connected with the end portion 129 (gate pad) of the gate line 121 and the end portion 179 (data pad) of the data line 171 through the contact holes 181 and 182, respectively. The contact aids 81 and 82 compensate for adhesion between the gate pad 129 of the gate line 121 and the data pad 179 of the data line 171 and an external device and protects the gate pad 129 of the gate line 121 and the data pad 179 of the data line 171.

Next, the upper panel 200 will be described with reference to FIG. 2.

A light blocking member 220 is positioned on a second insulation substrate 210 made of transparent glass or plastic. The light blocking member 220 blocks light leakage between the pixel electrodes 191 and defines an opening region facing the pixel electrode 191.

A plurality of color filters 230 is positioned on the second insulation substrate 210 and the light blocking member 220. Most of the color filters 230 exist in an area surrounded by the light blocking member 220, and the color filters 230 may be elongated along a column of the pixel electrodes 191. Each color filter 230 may display one of the primary colors such as three primary colors of red, green and blue.

In the exemplary embodiment, it is described that the light blocking member 220 and the color filters 230 are positioned on the upper panel 200, but at least one of the light blocking member 220 and the color filters 230 may instead be positioned on the thin film transistor array panel 100.

An overcoat 250 is positioned on the color filters 230 and the light blocking member 220. The overcoat 250 may be made of an (organic) insulating material, prevents the color filters 230 from being exposed, and provides a flat surface. The overcoat 250 may be omitted.

A common electrode 270 is positioned on the overcoat 250. The common electrode 270 is made of a transparent conductor such as ITO or IZO and receives a common voltage Vcom.

The liquid crystal layer 3 interposed between the thin film transistor array panel 100 and the upper panel 200 includes liquid crystal molecules having negative dielectric anisotropy, and the liquid crystal molecules may be aligned so that long axes thereof are vertical to the surfaces of the two display panels 100 and 200 without applying an electric field.

The pixel electrode 191 and the common electrode 270 form a liquid crystal capacitor together with the liquid crystal layer 3 portion therebetween to maintain the applied voltage even after the thin film transistor is turned off.

The pixel electrode 191 overlaps with a storage electrode line (not illustrated) to form a storage capacitor to thereby reinforce voltage storage capacity of the liquid crystal capacitor.

In the exemplary embodiment illustrated in FIG. 2, the backlight unit 300 may include a light source unit, a light guide plate, and the like and supplies light.

FIGS. 3 to 11 are process diagrams for describing a part of a manufacturing method of the thin film transistor array panel illustrated in FIG. 2. The detailed description for like constituent elements described above is omitted.

Figure 3:
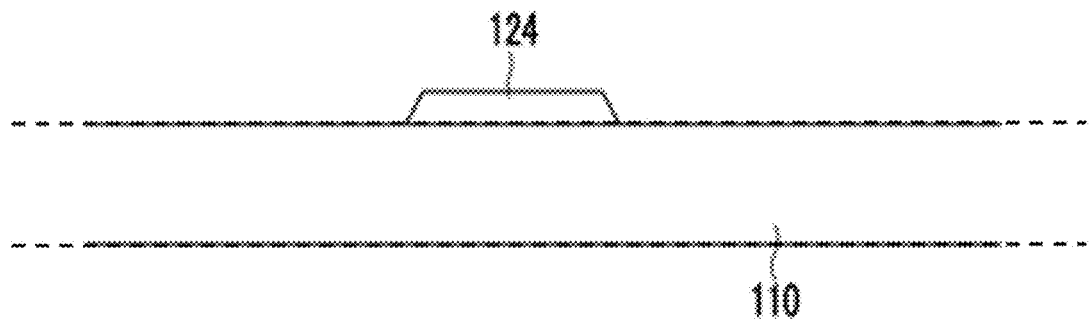
FIG. 3 illustrates a method of making the thin film transistor array panel of FIGS. 1 & 2 where a gate line is formed on a substrate.

Referring to FIG. 3, a plurality of gate lines 121 including a gate electrode 124 and a gate pad (not illustrated) is formed through a photolithography process by laminating the metal layer on the first insulation substrate 110 made of transparent glass or plastic through sputtering, and the like.

Figure 4:
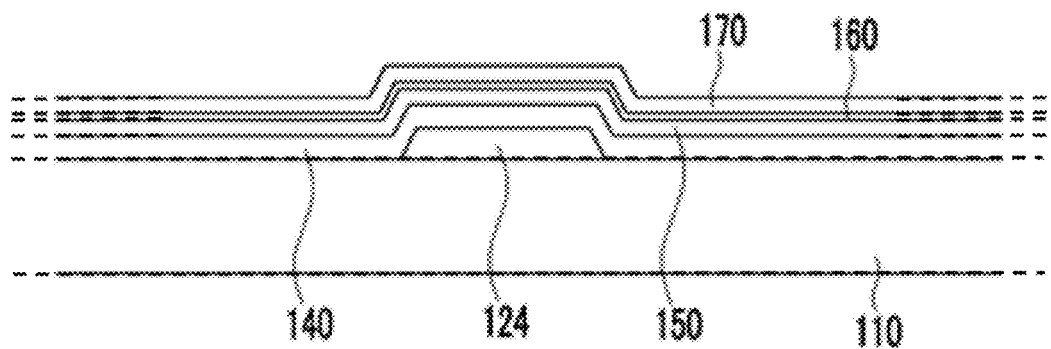
FIG. 4 illustrates a method of making the thin film transistor array panel of FIGS. 1 & 2 where a gate insulating layer, active layers and a data metal layer are sequentially deposited on the structure of FIG. 3.

Next, referring to FIG. 4, on the first insulation substrate 110 with the gate line 121, the gate insulating layer 140, an intrinsic amorphous silicon layer 150, and an impurity doped amorphous silicon layer 160 are sequentially formed. In this case, in this specification, the intrinsic amorphous silicon layer 150 and the impurity doped amorphous silicon layer 160 may be defined by active layers.

In detail, a process of formation the gate insulating layer 140 and the active layers 150 and 160 will be described.

First, the gate insulating layer 140 is laminated on the gate line 121 by a chemical vapor deposition (CVD) method. In this case, for example, silane gas ($SiH_4$), hydrogen gas ($H_2$), nitrogen gas ($NH_3$), or the like is supplied into a CVD chamber forming the gate insulating layer 140.

After formation of the gate insulating layer 140, the intrinsic amorphous silicon layer 150 made of amorphous silicon (a-Si:H) is laminated by supplying source gas including $SiF_4$ gas and $SiH_4$ gas in the CVD chamber. Preferably, a deposition temperature in the CVD chamber may be about 150° C. to 350° C., for example, 300° C.

In the process of formation of the semiconductor layer 154, in the aforementioned step, for example, the impurity doped amorphous silicon layer 160 is laminated by supplying silane gas ($SiH_4$), hydrogen gas ($H_2$), nitrogen gas ($NH_3$) and phosphine gas ($PH_3$) in the CVD chamber.

Next, the data metal layer 170 is sequentially laminated on the impurity doped amorphous silicon layer 160 by a sputtering method. The data metal layer 170 may be formed of metal such as chromium, aluminum, tantalum, molybdenum, titanium, tungsten, copper, and silver or alloys thereof, and may be formed by two or more layers having different physical properties.

Preferably, the data metal layer 170 may be deposited by a sputtering process as a layer made of copper or a copper alloy.

Figure 5:
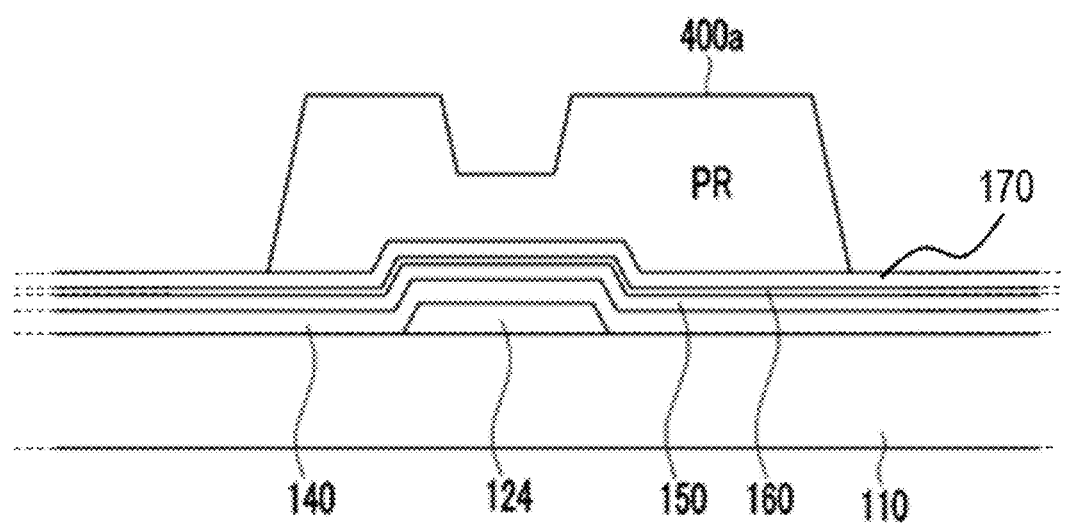
FIG. 5 illustrates a method of making the thin film transistor array panel of FIGS. 1 & 2 where a photoresist layer is deposited and patterned on the structure of FIG. 4.

Next, referring to FIG. 5, a photoresist layer PR is laminated on the data metal layer 170. In this case, the photoresist layer PR is differentially exposed by using a mask including etching patterns at positions corresponding to desired patterns of the semiconductor layer and the data metal layer. According to the exposure result, as illustrated in FIG. 5, an etching mask pattern 400a is disposed on the data metal layer 170.

In general, the etching mask pattern is disposed at a position where an intrinsic semiconductor stripe 151 including the projection portion 154, the plurality of ohmic contacts 161, the plurality of data lines 171 including the source electrode 173 and the end portion 179 (data pad), and the plurality of drain electrodes 175 are to be formed. The etching mask pattern 400a illustrated In FIG. 5 is disposed in a region where the thin film transistor is to be formed, and a height of a portion where the channel region of the thin film transistor is to be formed on the gate electrode 124 is lower than that of the periphery by about one-half. In addition, although not illustrated, another etching mask pattern is disposed in a region where the linear data line 171 and the end portion 179 (data pad) of the data line 171 are to be formed.

Figure 6:
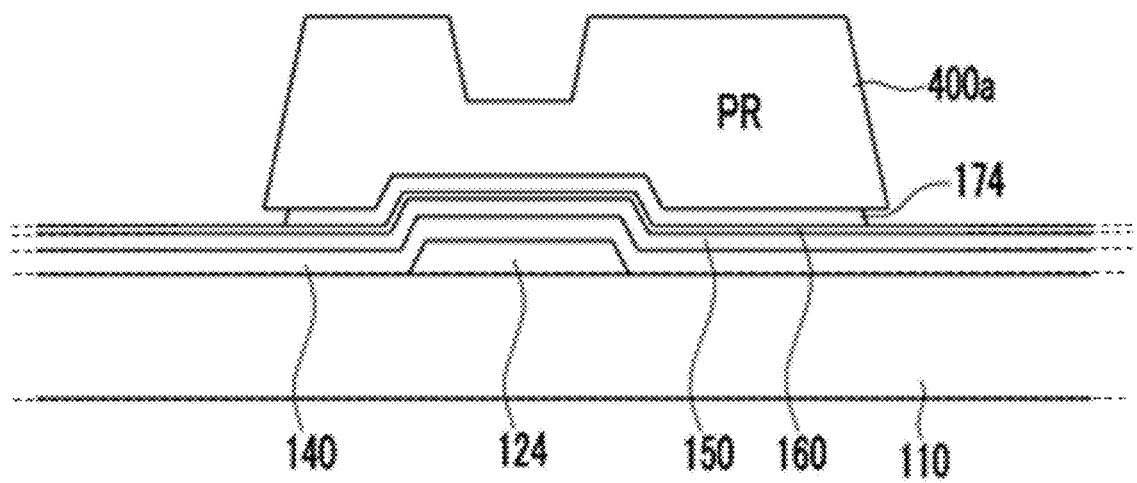
FIG. 6 illustrates a method of making the thin film transistor array panel of FIGS. 1 & 2 where the data metal layer in the structure of FIG. 5 is subjected to a first wet etch.

Next, referring to FIG. 6, a first wet etching process in which the data metal layer 170 is etched by using the mask pattern 400a as an etching mask is performed. In the wet etching, since the data metal layer 170 is isotropically etched by a wet-etchant, under cutting may occur, in which the side of the data layer 174 generated by the first wet etching process is further depressed than the mask pattern 400a. As a result, as illustrated in FIG. 6, the data layer 174 having the end portion 179 (data pad) is formed, and an etch surface N is exposed at the side of the data layer 174 etched by the under cutting.

Figure 7:
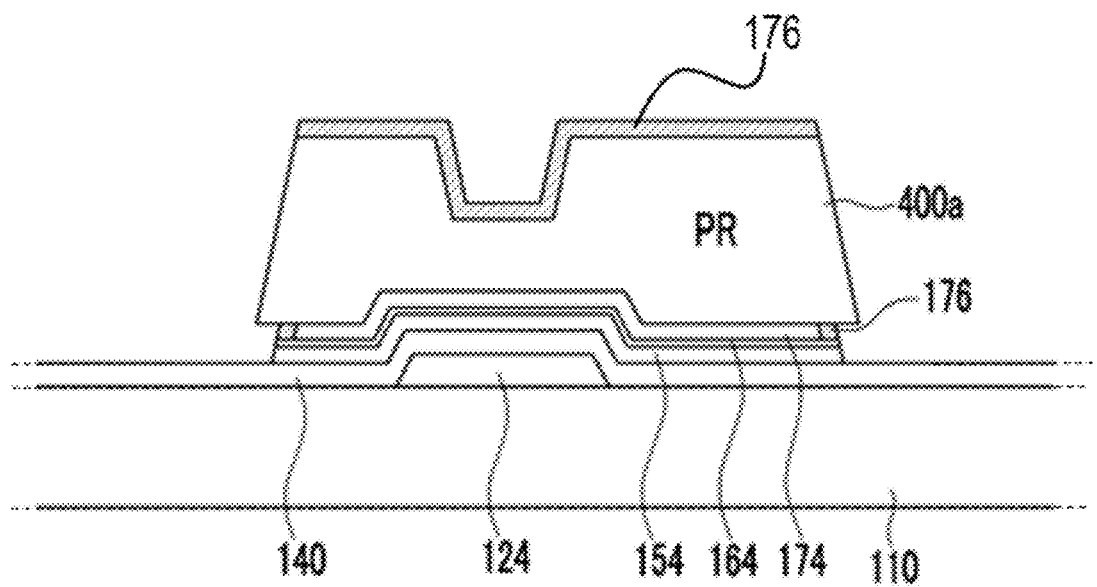
FIG. 7 illustrates a method of making the thin film transistor array panel of FIGS. 1 & 2 where the active layers are patterned by a $NF_3/H_2$ dry etch.

Next, referring to FIG. 7, an active etching process of etching the intrinsic amorphous silicon layer 150 and the impurity doped amorphous silicon layer 160 by using the mask pattern 400a as an etching mask, is performed. The active etching process according to the exemplary embodiment of the present invention uses the dry-etch process using $NF_3/H_2$ gas.

As a result, as illustrated in FIG. 7, the intrinsic amorphous silicon layer 150 and the impurity doped amorphous silicon layer 160 are removed from a portion except for the data line including the end portion 179 (data pad) and a lower portion of the data layer 174 of the thin film transistor to form the semiconductor 154 and the ohmic contact 164.

As such, since the intrinsic amorphous silicon layer 150 and the impurity doped amorphous silicon layer 160 are etched by using the same etching mask pattern 400a as the process of formation of the data line (not illustrated) including the end portion 179 and the data layer 174, the semiconductor 154 has substantially the same planar form as the data line (not illustrated), the data layer 174, and the ohmic contact 164 therebelow.

In addition, in the active etching process according to the exemplary embodiment of the present invention, a silicon compound 176 using $NF_3/H_2$ gas used in the active etching process is generated on the etch surface N of the data layer 174 of the thin film transistor and on the etching mask pattern 400a. The silicon compound 176 using $NF_3/H_2$ gas may generate $(NH_4)_2SiF_6$.

In the four-sheet mask process in the related art, as an etching method of removing the intrinsic amorphous silicon layer 150 and the impurity doped amorphous silicon layer 160, a dry etching method using mixed gas such as chlorine-based gas such as HCL gas and $Cl_2$ gas and $SF_6$ gas is used. The chlorine-based gas reacts with copper (Cu) included in the data layer 174 on the etch surface N, copper chloride (CuCl(s) and $CuCl_2$(s)) as reaction by-products is generated, and copper chloride (CuCl(s) and $CuCl_2$(s)) remains on the data layer 174 to cause an increase of wiring resistance and wiring defect. Accordingly, in order to prevent the aforementioned reaction by-products from being generated, chlorine-based gas is omitted, and even in the case of etching using only $SF_6$ gas, copper fluoride ($CuF_2$(s)) is generated as the reaction by-products. That is, even in the case of using only $SF_6$ gas, the aforementioned defects are caused.

Accordingly, in the active etching process according to exemplary embodiment of the present invention, a structure illustrated in FIG. 7 is formed by performing the dry etching process using $NF_3/H_2$ gas.

Figure 8:
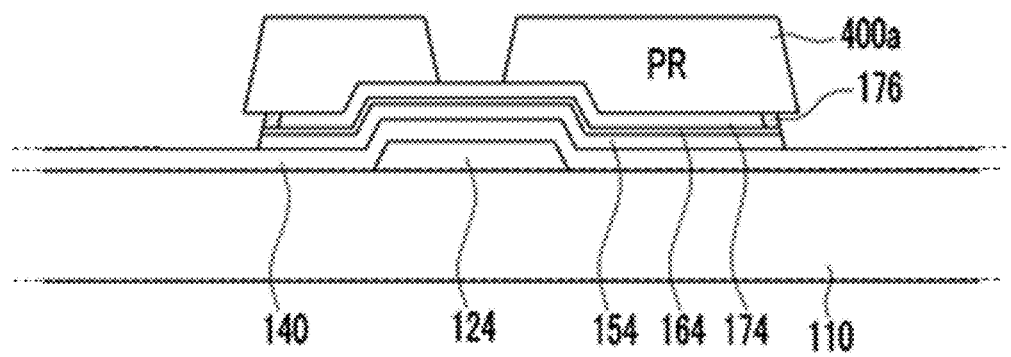
FIG. 8 illustrates a method of making the thin film transistor array panel of FIGS. 1 & 2 where the photoresist layer is ashed back so that the portion corresponding to the half tone is removed exposing a portion of the structure corresponding to the channel region of a TFT.

Next, as illustrated in FIG. 8, by ashing the photoresist etching mask pattern 400a by using oxygen plasma, the height of the etching mask pattern 400a laminated on the thin film transistor is decreased to one-half and simultaneously, the remaining etching masks are removed even though not illustrated.

In this case, preferably, in the ashing process according to the exemplary embodiment of the present invention, as ashing conditions for reinforcing an anisotropic property according to a dry etching characteristic, low pressure and high bias power may be used.

Figure 9:
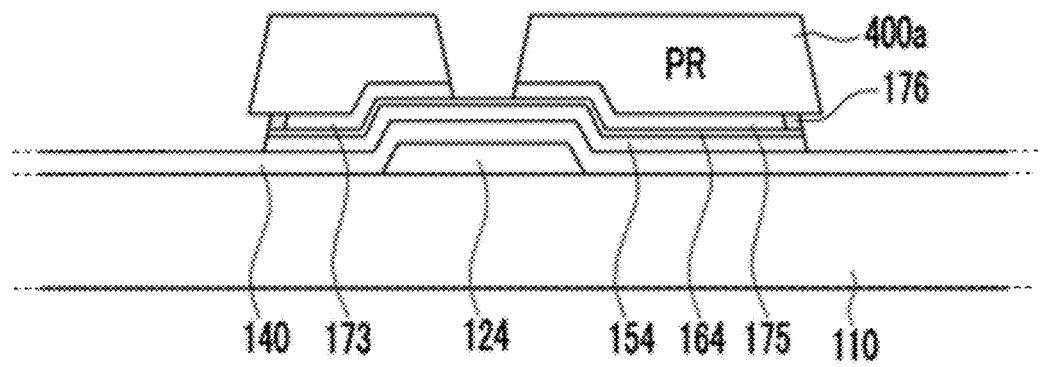
FIG. 9 illustrates a method of making the thin film transistor array panel of FIGS. 1 & 2 where a second wet etch is conducted to remove portions of the data metal layer corresponding to the channel region.
Figure 10:
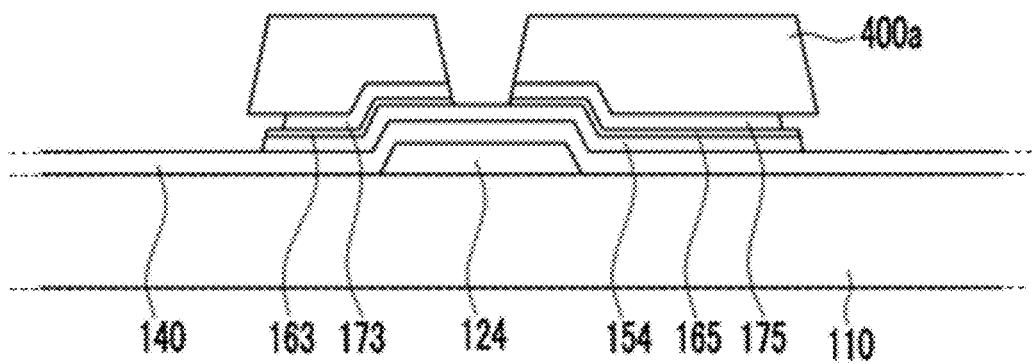
FIG. 10 illustrates a method of making the thin film transistor array panel of FIGS. 1 & 2 where the top one of two active layers is removed to produce the channel region of the TFT.

Next, as illustrated in FIGS. 9 and 10, a second wet etching process of integrally removing the data metal layer 174 which remains in the channel region of the thin film transistor and the impurity doped amorphous silicon layer 164 by using the remaining etching mask pattern 400a, is performed. As a result, on the data metal layer 174, the source electrode 173 and the drain electrode 175 which overlap with the gate electrode 124 by a predetermined distance from the gate electrode 124, are formed.

During the active dry etching process using $NF_3/H_2$ gas used to produce the structure of FIG. 6, the silicon compound 176 is laminated on the etch surface of the data metal layer 174 and serves as an etching stop layer in the second wet etching process of removing the metal layer. Accordingly, as illustrated in FIG. 9, only a part of an intermediate region of the data layer 174 is etched and the side may be prevented from being etched according to the etching mask pattern 400a. As a result, etch skew may be prevented from occurring when the metal layer is exposed in the etching process.

Further, as illustrated in FIG. 10, in the second wet etching process, the exposed impurity doped amorphous silicon layer 164 is removed from a separation portion of the source electrode 173 and the drain electrode 175, and as a result, the ohmic contacts 163 and 165 are completed and the intrinsic semiconductor 154 portion therebelow is exposed. In this case, due to the silicon compound 176 formed on the side of the source electrode 173 and the drain electrode 175, the impurity doped amorphous silicon layer 164 remaining in the channel region of the thin film transistor may also be etched by using the wet etching method.

Accordingly, the data layer 174 formed in the channel region of the thin film transistor and the impurity doped amorphous silicon layer 164 may be removed by the same wet etching process, and the wiring skew may be prevented from being generated through the silicon compound 176.

Further, as described above, the data metal layer 174 may be etched by using the second wet etching process and the amorphous silicon layer 164 may be etched by using the dry etching process using $SF_6$-based gas.

Figure 11:
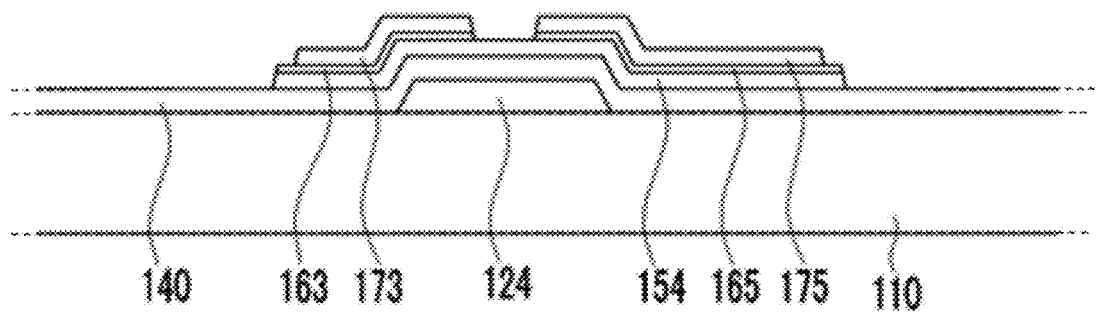
FIG. 11 illustrates a method of making the thin film transistor array panel of FIGS. 1 & 2 where the photoresist layer of FIG. 10 is totally removed to complete formation of the TFT.

Next, as illustrated in FIG. 11, the intrinsic semiconductor 154, the ohmic contacts 163 and 165 which are the impurity doped semiconductor, the source electrode 173, and the drain electrode 175 are completed by removing the etching mask pattern 400a.

Thereafter, as illustrated in FIG. 2, after formation of the passivation layer 180 to cover the semiconductor 154, the contact hole 185 exposing a part of the drain electrode 175 is formed through the photolithography process. A transparent conductive layer (not illustrated) is deposited on the passivation layer 180, and the pixel electrode 191 electrically connected with the drain electrode is formed through the photolithography process.

Hereinabove, the four-sheet mask process is described, but the present invention is not limited thereto, and of course, the five-sheet mask process may also be used even five-sheet mask process, of course.

Figure 13:
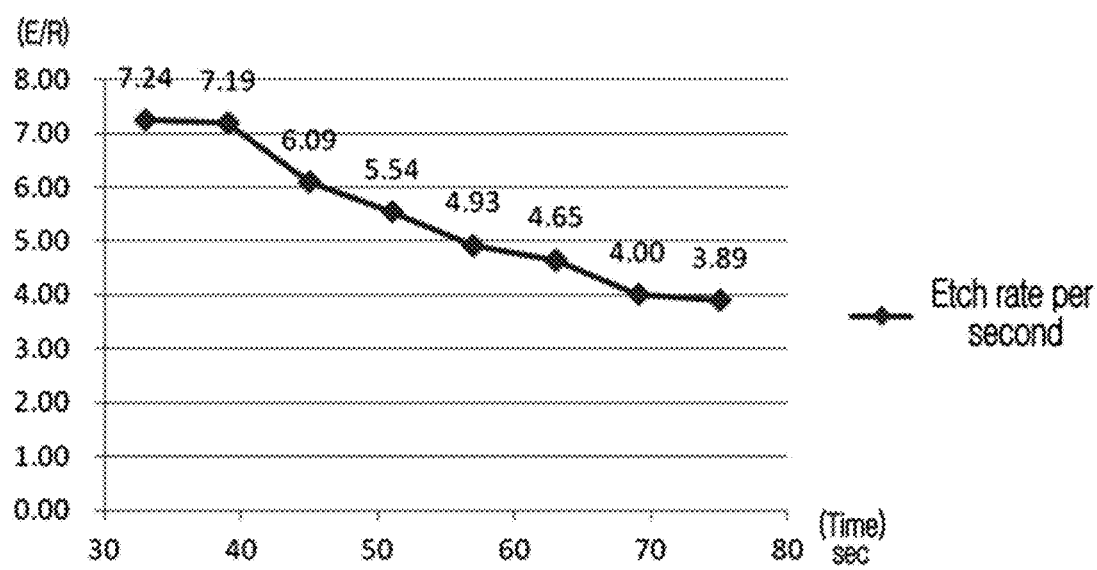

FIGS. 12 and 13 are diagrams for describing a performance experiment result of a wet etching process with respect to an impurity doped amorphous silicon layer according to the exemplary embodiment of the present invention.

Data illustrated in FIG. 12 represent an etch rate E/R per second derived from an a-Si etch rate of the impurity doped amorphous silicon layer measured according to an etching condition of additionally over-etching up to 75 seconds by 6 seconds based on etchant TCE-W02@25° C., 5-line normal deposition, 5-line etching equipment, and a normal etch time of 33 seconds, FIG. 13 illustrates an etch rate E/R per second of the active layer according to a time (seconds) based on the data of FIG. 12 as a graph.

Referring to FIG. 13, during wet etching for the active layer, it can be seen that the etch rate E/R per second is high in an early stage in which the wet etching is performed, but the etch rate E/R per second is reduced with time. It can be seen that the etch rate E/R per second of the impurity doped amorphous silicon layer 160 positioned above the active layer which first reacts with the etchant is the maximum, but the etch rate E/R per second is saturated with time, and as a result, the intrinsic amorphous silicon layer 150 may be prevented from being etched during the second wet etching by controlling the thickness of the impurity doped amorphous silicon layer 160.

Figure 14:
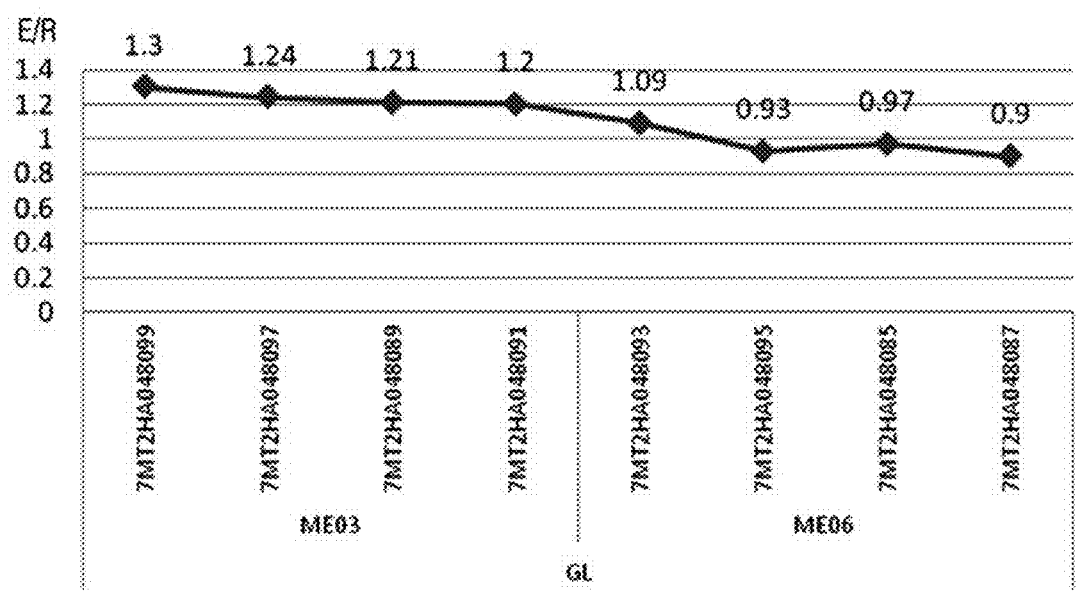
FIGS. 14 and 15 are diagrams for describing a performance result of a wet etching process with respect to a gate insulating layer GL/GH of the thin film transistor according to the exemplary embodiment of the present invention.
Figure 15:
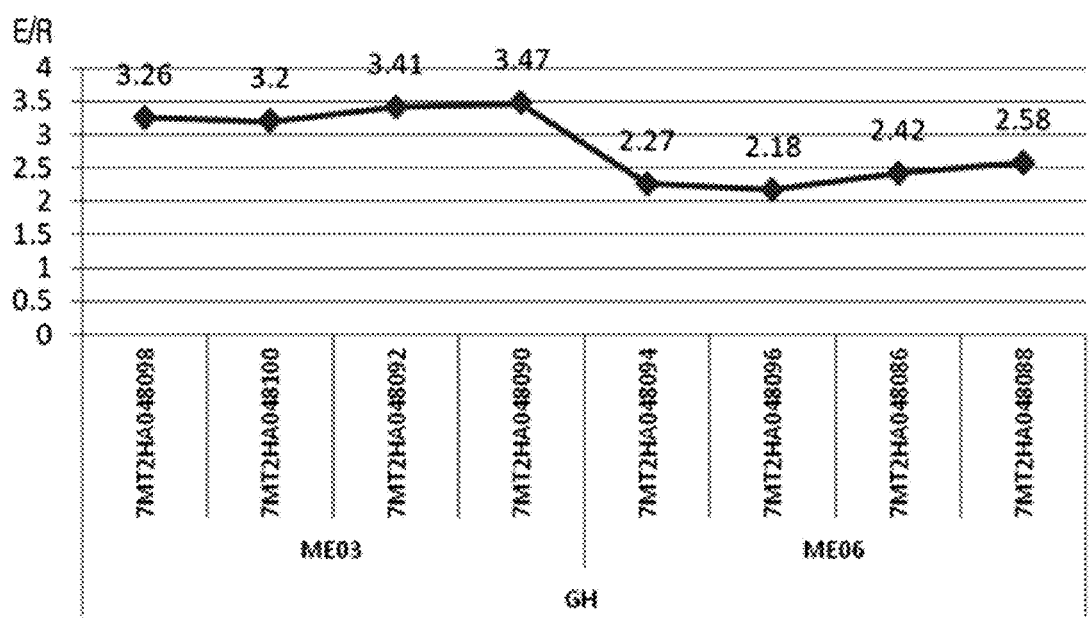

FIGS. 14 and 15 are diagrams for describing a performance result of a wet etching process with respect to a gate insulating layer GL/GH of the thin film transistor according to the exemplary embodiment of the present invention.

FIGS. 14 and 15 are graphs illustrating a wet etching process result performed under etching conditions of etchant TCE-W02@25° C., GH layer 4000A (7BFCV07_PC02), GL layer 4000A (7BFCV07_PC04), use of etching equipment No. 7BFME03 and No. 7BFME06, and an etch required time of 66 seconds based the measured data.

FIG. 14 illustrates a graph of the etch rate E/R per second according to use of the etching equipment No. 7BFME03 and No. 7BFME06 with respect to the first gate insulating layer (GL layer) under the aforementioned etching conditions, and FIG. 15 illustrates a graph of the etch rate E/R per second according to use of the etching equipment No.

7BFME03 and No. 7BFME06 with respect to the second gate insulating layer (GH layer) under the aforementioned etching conditions.

As compared with the etch rate E/R per second of 4.00 to 4.65 at the same etching required time of 66 seconds with respect to the active layer illustrated in FIG. 12, it can be seen that a wet etch rate of 0.9 to 1.3 of the first gate insulating layer (GL layer) and a wet etch rate of 2.18 to 3.47 of the second gate insulating layer (GH layer) are smaller than the etch rate for the active layer.

Accordingly, in the manufacturing process of the thin film transistor array panel according to the exemplary embodiment of the present invention described above, even though the wet etching process is used when removing the impurity doped amorphous silicon layer 160 formed in a partial region on the drain electrode, the gate insulating layer may be prevented from being etched.

Figure 16:
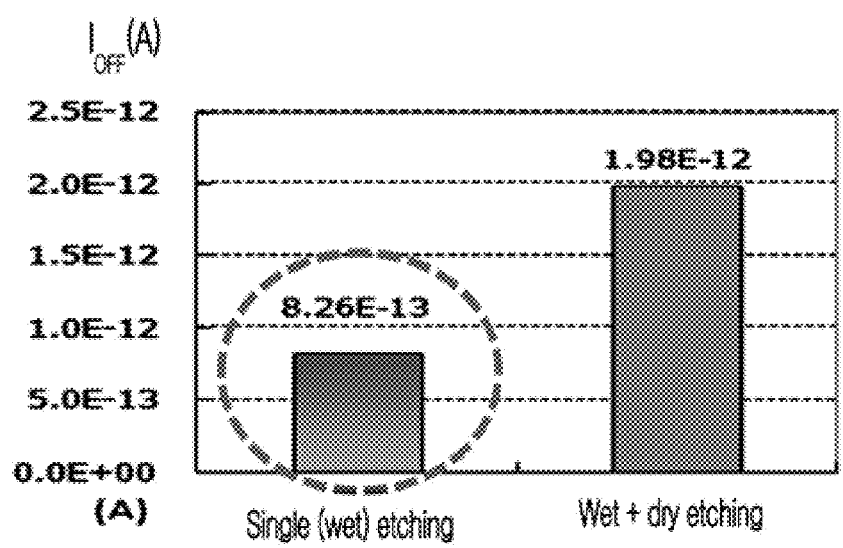
FIGS. 16, 17A, and 17B are experimental graphs for comparing etching process results with respect to a data metal layer and an impurity doped amorphous silicon layer according to the exemplary embodiment of the present invention.

FIGS. 16 and 17 are experimental graphs for comparing etching process results with respect to a data metal layer and an impurity doped amorphous silicon layer according to the exemplary embodiment of the present invention.

FIG. 16 compares results of off leakage current Ioff measured during single wet etching in which the data metal layer 170 and the impurity doped amorphous silicon layer 160 are integrally wet etched and wet-dry combined etching in which the data metal layer 170 is wet-etched and the impurity doped amorphous silicon layer 160 is dry-etched according to the exemplary embodiment of the present invention.

Referring to FIG. 16, when Ioff in the wet-dry combined etching which is 1.98-12 and Ioff in the single wet etching which is 8.26-13 are compared with each other, it can be seen that during the single wet etching according to the exemplary embodiment of the present invention, the leakage current has a significantly low value as compared with the combined etching. That is, when the data metal layer 170 is wet-etched, the impurity doped amorphous silicon layer 160 is integrally wet-etched, and as a result, it can be seen that the off leakage current Ioff amount is improved.

Figure 17A:
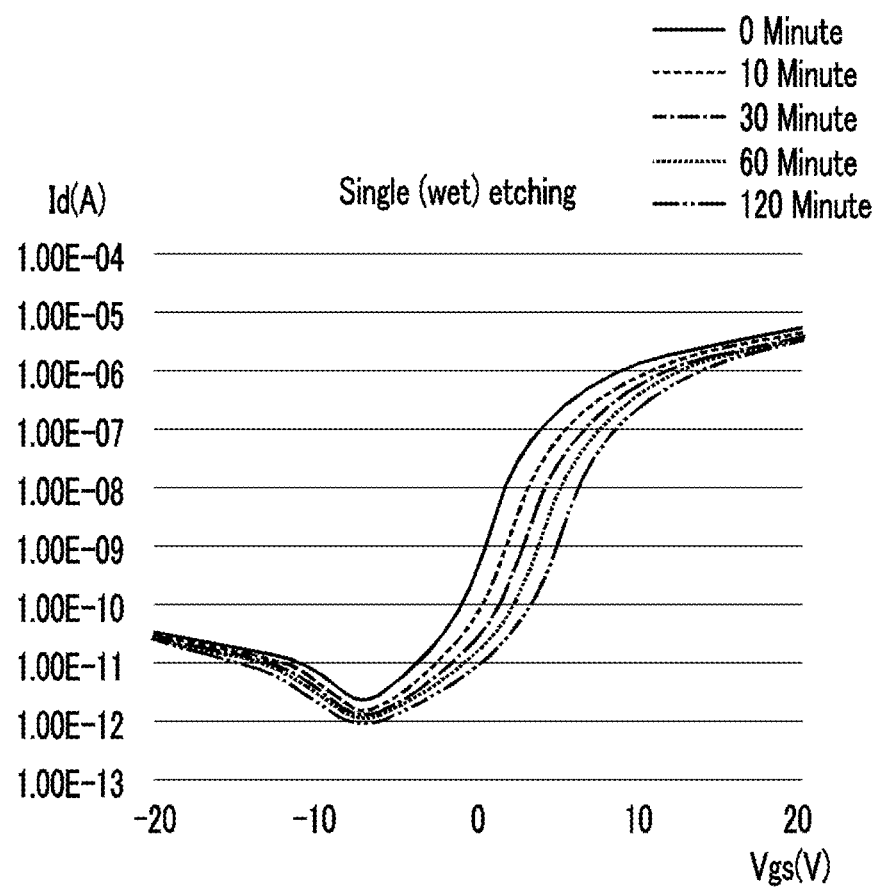
Figure 17B:
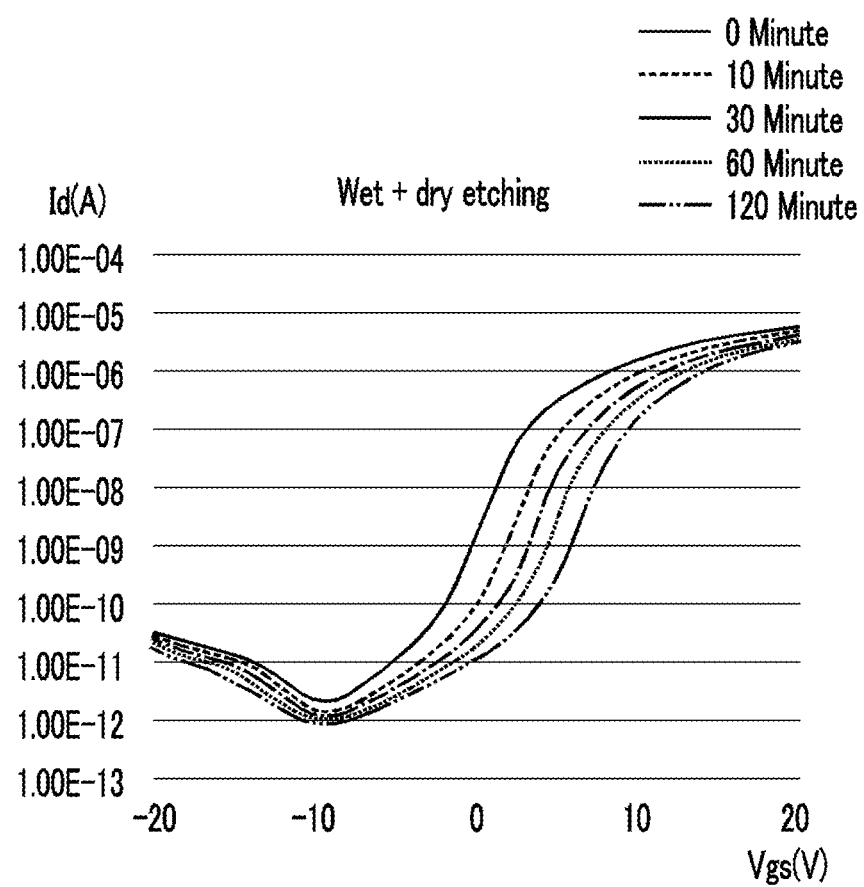

FIG. 17A illustrates a result of current Id measured in source/drain electrodes during the single wet etching in which the data metal layer 170 and the impurity doped amorphous silicon layer 160 are integrally wet-etched when voltage Vg is applied to the gate electrode. FIG. 17B illustrates a result of current Id measured in the source/drain electrodes during the wet-dry combined etching in which the data metal layer 170 is wet-etched and the impurity doped amorphous silicon layer 160 is dry-etched when the voltage Vg is applied to the gate electrode.

Referring to FIGS. 17A and 17B, it can be seen that even under the same gate electrode condition, a reduction amount of Id measured during the single wet etching is smaller than that of Id measured during the combined etching with time, and the gate electrode is driven well during the single wet etching. That is, as illustrated in FIG. 15, it can be seen that during the single wet etching, the value of off leakage current Ioff is improved as compared with the combined etching.

The off leakage current Ioff causes fine driving of the switching element even when the switching element is turned off to be the cause of an afterimage. Accordingly, it can be seen that the liquid crystal display of the exemplary embodiment is very advantageous to improvement of the afterimage.

Hereinabove, in the exemplary embodiment, the thin film transistor array panel applied to the liquid crystal display is described, but the description for the thin film transistor array panel 100 may be applied to any other display devices.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. A performance experiment of the thin film transistor array panel will be described.

DESCRIPTION OF SYMBOLS

3: Liquid crystal layer
81, 82: Contact aids
83: Overpass
100: Thin film transistor array panel
110: Substrate
121: Gate line
124, 124a, 124b: Gate electrode
129: gate pad, end portion of gate line
131: Storage electrode line
133a, 133b: Storage electrode
140: Gate insulating layer
150: Intrinsic amorphous silicon layer
151, 154: (Intrinsic) semiconductor
160, 164: Impurity doped amorphous silicon layer
163, 165: Ohmic contact
170, 174: Data metal layer
171: Data line
173: Source electrode
175: Drain electrode
179: data pad, end portion of data line
180: Passivation layer
191: Pixel electrode
200: Common electrode panel
220: Light blocking member
230: Color filter
250: Overcoat
270: Common electrode
400a, 400b, 400c: Etching mask pattern

What is claimed is:

1. A manufacturing method of a thin film transistor array panel, comprising
    forming a gate line including a gate electrode on a substrate;
    forming sequentially a gate insulating layer, an active layer, a data metal layer, and a photoresist etching mask pattern on the gate line;
    etching the data metal layer with the same shape as the photoresist etching mask pattern;
    etching the active layer by using the photoresist etching mask pattern by a dry-etch process performed by using gas including at least one of $NF_3$ and $H_2$ while forming a silicon compound on an etch surface of the data metal layer by the dry-etch process;
    forming a data line including a source electrode and a drain electrode for completing a channel region on the active layer; and
    forming a pixel electrode exposing the drain electrode and electrically connected with the drain electrode.

2. The manufacturing method of claim 1, wherein during the formation of the data line, the silicon compound formed on the etch surface of the data metal layer prevents the etch surface of the data metal layer from being etched.

3. The manufacturing method of claim 1, wherein the formation of the data line further includes exposing a part of the data metal layer by etching the photoresist etching mask pattern with a predetermined thickness through ashing; and forming a source electrode and a drain electrode for completing the channel region of the thin film transistor by etching the exposed data metal layer.

4. The manufacturing method of claim 3, wherein the formation of the data line is performed by a wet etching process with respect to the data metal layer.

5. The manufacturing method of claim 3, wherein at least one of low pressure and high bias power satisfies ashing condition.

6. The manufacturing method of claim 3, wherein the forming of the active layer comprises:

laminating an intrinsic amorphous silicon layer on the gate insulating layer; and laminating an impurity doped amorphous silicon layer on the intrinsic amorphous silicon layer.

7. The manufacturing method of claim 6, wherein the formation of the data line further includes etching the impurity doped amorphous silicon layer exposed between the source electrode and the drain electrode of the thin film transistor.

8. The manufacturing method of claim 7, wherein the etching of the impurity doped amorphous silicon layer is performed by a wet etching process.

9. The manufacturing method of claim 7, wherein during the etching of the impurity doped amorphous silicon layer, the silicon compound formed on the etch surface of the data metal layer is etched.

* * * * *